US005780913A

United States Patent [19]

Muramatsu et al.

[11] Patent Number: 5,780,913

[45] Date of Patent: Jul. 14, 1998

[54] PHOTOELECTRIC TUBE USING ELECTRON BEAM IRRADIATION DIODE AS ANODE

[75] Inventors: Masaharu Muramatsu; Motohiro Suyama; Koei Yamamoto, all of Hamamatsu, Japan

[73] Assignee: Hamamatsu Photonics K.K., Shizuoka-ken, Japan

[21] Appl. No.: 954,616

[22] Filed: Oct. 27, 1997

Related U.S. Application Data

[63] Continuation of Ser. No. 557,328, Nov. 14, 1995, abandoned.

[51] Int. Cl.$^6$ .......................... H01L 31/115; H01J 31/49

[52] U.S. Cl. .................... 257/429; 250/333; 250/370.14; 250/397; 250/398; 250/399; 257/77; 257/184; 257/434; 257/436

[58] Field of Search .......................... 250/214 R, 214 VT, 250/333, 370.14, 397, 398, 388; 257/429, 434, 436, 463, 77, 184, 458, 461

[56] References Cited

U.S. PATENT DOCUMENTS

| | | | |
|---|---|---|---|
| 5,019,886 | 5/1991 | Sato et al. | 257/429 |
| 5,120,949 | 6/1992 | Tomasetti | 250/207 |
| 5,146,296 | 9/1992 | Huth | 357/19 |
| 5,181,083 | 1/1993 | Pezzani | 257/491 |
| 5,239,193 | 8/1993 | Benton et al. | 257/292 |
| 5,332,919 | 7/1994 | Fujimura | 257/434 |
| 5,360,987 | 11/1994 | Shibib | 257/446 |
| 5,449,924 | 9/1995 | Hur et al. | 257/54 |
| 5,491,339 | 2/1996 | Mitsui et al. | 250/310 |

FOREIGN PATENT DOCUMENTS

| | | |
|---|---|---|
| 50-54290 | 5/1975 | Japan . |

OTHER PUBLICATIONS van Geest et al, "Hybrid Phototube With Si Target", Nuclear Instruments and Methods in Physics Research, A310, 1991, North-Holland, pp. 261–266.

DeSalvo et al, "First Results on the Hybrid Photodiode Tibe", Nuclear Instruments and Methods in Physics Research, A315, 1992, North-Holland, pp. 375–384.

*Primary Examiner*—Mahshid D. Saadat
*Assistant Examiner*—Allan R. Wilson
*Attorney, Agent, or Firm*—Cushman Darby & Cushman IP Group of Pillsbury Madison & Sutro, LLP

[57] ABSTRACT

When light is incident on the photoelectric surface of this electron tube, photoelectrons are emitted. These photoelectrons are accelerated and incident on an electron beam irradiation diode. A reverse voltage of about 100 V is applied to the electron beam irradiation diode to form a depletion region almost throughout an anode layer and near the p-n junction interface of a silicon substrate. The incident accelerated electrons release a kinetic energy in a heavily doped p-type layer having an electron incidence surface and the depleted anode layer to form electron-hole pairs. In this case, since the heavily doped p-type layer having the electron incidence surface is very thin, the energy is hardly released in this layer, and almost all energy is released in the depletion region. Signal charges extracted from the electron-hole pairs formed upon releasing the energy are output as a signal from two electrodes.

8 Claims, 5 Drawing Sheets

PHOTOELECTRIC TUBE USING ELECTRON BEAM IRRADIATION DIODE AS ANODE

This is a continuation of application Ser. No. 08/557,328, filed on Nov. 14, 1995, which was application Ser. No. 08/954,616.

BACKGROUND OF THE INVENTION

1. Field of the Invention

The present invention relates to a photoelectric tube for detecting incident light and, more particularly, to a photoelectric tube using an electron beam irradiation diode as an anode.

2. Related Background Art

When electrons are incident on a silicon element, the electrons release a kinetic energy and finally cease to move. In the silicon element, an electron-hole pair is formed per released energy of 3.6 eV. When electrons emitted from a photoelectric surface to which a voltage of −10 kV is applied are incident on the silicon element, about 2,800 electron-hole pairs are formed, and one of each pair can be extracted as a signal charge. Therefore, a highly sensitive photodetector capable of quantitatively measuring the number of incident photons can be constituted in principle when a silicon diode serving as an anode is sealed in an electron tube having a photoelectric surface, and development of such products is in progress.

FIGS. 5A and 5B are views showing the arrangement of an electron beam irradiation diode serving as a semiconductor electron detector used as an anode in a conventional electron tube to which the above principle is applied. FIG. 5A is a sectional view showing the arrangement of this electron beam irradiation diode, and FIG. 5B is a graph showing the internal field strength distribution obtained upon application of a voltage between the electrodes of this semiconductor electron detector. This electron beam irradiation diode is constituted by a high-resistivity n-type silicon substrate 710 having a thickness of 200 μm and a resistivity of 1 kΩ·cm, a heavily doped p-type diffusion layer 720 forming so-called step junction with respect to the substrate 710, containing a p-type impurity at $5\times10^{19}$ $cm^{-3}$ and having a depth of 0.5 μm, a silicon oxide film 730 formed in a surface region of the heavily doped p-type diffusion layer 720 excluding the electron beam incident region and on a surface of the substrate 710 on the side where the heavily doped p-type diffusion layer 720 is formed, a heavily doped n-type layer 740 which is formed on a surface of the substrate 710 opposite to the side where the heavily doped p-type diffusion layer 720 is formed and serves to stop extension of a depletion layer in the substrate 710 upon application of a reverse voltage, an electrode 751 formed in a surface region of the heavily doped p-type diffusion layer 720 excluding the electron beam incident region, and an electrode 752 formed on the surface of the heavily doped n-type layer 740.

The reason why no silicon oxide film is formed in the electron beam incident region of the heavily doped p-type diffusion layer 720 is as follows. That is, since a silicon oxide film forms a dead band, charges generated as electron-hole pairs formed by the kinetic energy of incident electrons absorbed in the silicon oxide film cannot be extracted as signal charges.

The reason why a high-resistivity (1 kΩ·cm) silicon member is used as the substrate 710 is to extend the depletion layer upon application of a reverse voltage, and to minimize the junction capacitance to achieve a high-speed operation. For example, when a reverse voltage of 150 V is applied to the above electron beam irradiation diode to form a depletion layer throughout the thickness of the substrate 710, the junction capacitance is about 0.5 pF. Since the external load resistance is normally 50Ω, the CR time constant is 25 psec, and an operation on the nanosecond order required for an electron detector sealed in an electron tube is enabled. The silicon oxide film 730 is formed to suppress a dark current.

FIG. 5B is a graph showing the field strength distribution between A and B in FIG. 5A, which is obtained when a reverse voltage is applied to the above electron beam irradiation diode. As shown in FIG. 5B, an electric field for moving signal charges (electrons) is formed in the depletion layer, which has a maximal value on the p-n junction interface.

When light is incident on the photoelectric surface of the electron tube, electrons are emitted from the photoelectric surface. These electrons are accelerated by a voltage applied between the photoelectric surface and the electron beam irradiation diode serving as an anode. Electrons selected through a light-shielding plate are incident on the electron beam irradiation diode from the electron beam incident surface of the heavily doped p-type diffusion layer 720. The incident electrons release a kinetic energy in the silicon member constituting the electron beam irradiation diode, thereby forming electron-hole pairs. At this time, a reverse voltage is applied to the electron beam irradiation diode to form a depletion layer in the substrate 710. Signal charges generated as electron-hole pairs in the depletion layer are output as a signal current.

The electron beam irradiation diode used in the conventional electron tube has the above arrangement, and the heavily doped impurity layer on which an electron beam is incident has a high conductivity. This is because, even when a depletion region grown in this heavily doped impurity layer upon application of a reverse voltage reaches the interface with respect to the silicon oxide film, the dark current flowing due to so-called surface level can be prevented from being largely increased. Since the depletion region in the heavily doped impurity layer is formed in only a very thin region near the p-n junction interface, most region of the heavily doped impurity layer extending from the electron beam incident surface to the depletion layer becomes a dead band. No signal charge can be effectively extracted from electron-hole pairs generated in this dead band, resulting in a degradation in sensitivity and accuracy of the electron tube as a photodetector. Therefore, the heavily doped impurity layer is preferably as thin as possible.

However, as the heavily doped impurity layer is made thinner, field concentration increases to decrease the breakdown voltage. Additionally, when the degree of curve of junction with respect to the thickness of the heavily doped impurity layer becomes large, the breakdown voltage excessively becomes small. More specifically, to ensure application of a reverse voltage for forming a sufficient depletion region in a high-resistivity substrate to achieve a high-speed operation, a heavily doped impurity layer having a certain thickness is essential. Therefore, a degradation in sensitivity and accuracy of the electron tube as a photodetector are unavoidable.

In addition, electrons emitted from the photoelectric surface are accelerated and incident on the electron beam irradiation diode. The electrons sometimes pass through the p-n junction interface until they release a kinetic energy and stop.

For example, when electrons accelerated to 10 keV are incident on silicon, the electrons enter the silicon to several μm from the incident surface on the average. For this reason, when the heavily doped impurity layer has a thickness of 0.5 μm, the electrons almost surely pass through the p-n junction interface where the field strength is maximized (FIG. 5B). When the high-energy electrons pass through, a lot of energy levels are formed in the bandgap of the silicon (S.M. SZE: Physics of Semiconductor Devices, p. 49).

These energy levels cause a dark current. Generation of a lot of energy levels in the bandgap near the p-n junction interface where the field strength is maximized causes a large dark current and adversely affects the sensitivity and accuracy of the electron tube.

In addition, when continuous irradiation of electrons deteriorates the p-n junction interface, the withstand voltage with respect to a reverse voltage may decrease. When the withstand voltage decreases, a reverse voltage for extending the depletion layer throughout the substrate cannot be applied. The CR time constant becomes large, resulting in a decrease in operation speed.

SUMMARY OF THE INVENTION

The present invention has been made in consideration of the above situations, and has as its object to provide an electron tube which improves sensitivity and accuracy by realizing an electron beam irradiation diode having a dead band so thin as to prevent incident electrons from entering the p-n junction interface.

In an electron tube of the present invention, the p-n junction interface of an electron irradiation diode as a sealed semiconductor electron detector is formed by a substrate lightly doped with an impurity and a lightly doped impurity layer. A depletion region formed upon application of a reverse voltage is formed throughout the substrate and the lightly doped impurity layer in the direction of their thickness. In addition, a heavily doped impurity layer having the same conductivity type as that of the lightly doped impurity layer is formed on a surface of the lightly doped impurity layer opposite to the p-n junction interface to stop growth of the depletion region. As a result, the thickness of the heavily doped impurity layer does not act as a factor that determines the withstand voltage, so the heavily doped impurity layer can be made thin. Problems in the conventional electron tube are solved by using the above advantages.

According to the present invention, there is provided a first electron tube in which a semiconductor electron beam detector is sealed, wherein the semiconductor electron beam detector comprises a silicon substrate having a first conductivity type, a first heavily doped impurity layer formed on one surface of the silicon substrate and having the first conductivity type, a lightly doped impurity layer formed on the other surface of the silicon substrate and having a second conductivity type, an isolation layer formed in a region surrounding the lightly doped impurity layer on the other surface of the silicon substrate and having the first conductivity type, a second heavily doped impurity layer formed on a surface of the lightly doped impurity layer and having the second conductivity type, a silicon oxide film formed on a surface of the isolation layer and in a region including a portion in the vicinity of a periphery of a surface of the second heavily doped layer, a first electrode formed on a surface of the first heavily doped impurity layer, and a second electrode formed on the surface of the second heavily doped impurity layer, and electrons are incident from the surface of the second heavily doped impurity layer where no silicon oxide film is formed.

According to the present invention, there is also provided a second electron tube in which a semiconductor electron beam detector is sealed, wherein the semiconductor electron beam detector comprises a wide bandgap layer formed in a region of the surface of the second heavily doped impurity layer of the semiconductor electron beam detector in the first electron tube, excluding a region where the silicon oxide film is formed and a region where the second electrode is formed, the wide bandgap layer consisting of a semiconductor material having a bandgap larger than that of the second heavily doped impurity layer, and forming a heterojunction with the second heavily doped impurity layer, and electrons are incident from a surface of the wide bandgap layer.

According to the present invention, there is also provided a third electron tube in which a semiconductor electron beam detector is sealed, wherein the semiconductor electron beam detector comprises a heavily doped impurity layer formed between the substrate and the lightly doped impurity layer of the semiconductor electron beam detector in the first electron tube.

According to the present invention, there is also provided a fourth electron tube in which a semiconductor electron beam detector is sealed, wherein the semiconductor electron beam detector comprises a heavily doped impurity layer formed between the substrate and the lightly doped impurity layer of the semiconductor electron beam detector in the second electron tube.

In the first electron tube according to the present invention, a reverse voltage is applied to the electron beam irradiation diode to form a depletion region throughout the lightly doped impurity layer in the direction of its thickness. Therefore, it is only the heavily doped impurity layer formed on the surface of the lightly doped impurity layer and having the same conductivity type as that of the lightly doped impurity layer, that is not depleted in the accelerated electron entering region of the electron beam irradiation diode. In addition, the isolation diffusion layer prevents the p-n junction interface from being exposed to the side surface, thereby suppressing the dark current.

When light is incident on the photoelectric surface of this electron tube, photoelectrons are emitted. The photoelectrons are accelerated and become incident on the electron beam irradiation diode. The incident accelerated electrons release a kinetic energy in the heavily doped impurity layer having an electron incidence surface and the lightly doped impurity layer or the substrate to form electron-hole pairs. In this case, since the heavily doped impurity layer having the electron incidence surface is very thin, the energy is hardly released there, and almost all energy is released in the depletion region. Signal charges extracted from electron-hole pairs formed upon releasing the energy are output as a signal from the electrodes.

In the second electron tube according to the present invention, in addition to the arrangement of the electron beam irradiation diode in the first electron tube, the very thin wide gap layer is formed on the accelerated electron incidence surface to form a heterojunction with the electron incidence surface. As a result, a satisfactory accumulation state for signal charges is assumed. In this state, when photoelectrons emitted upon incidence of light on the photoelectric surface of the electron tube are accelerated and incident on the electron beam irradiation diode, electron-hole pairs are formed as in the first electron tube. Since a satisfactory accumulation state is set near the accelerated electron incidence surface, one of each signal charge efficiently reaches the p-n junction interface, and recombination with the other of the signal charge can be minimized near the surface. The efficiently acquired signal charges are output as a signal from the electrodes. The wide bandgap layer also acts as a passivation layer for protecting the electron beam irradiation diode from being contaminated by an alkali metal generated upon sealing.

In the third electron tube according to the present invention, in addition to the arrangement of the electron beam irradiation diode in the first electron tube, the heavily doped impurity layer having the same conductivity type as that of the lightly doped impurity layer is formed between the substrate and the lightly doped impurity layer. Upon application of a reverse voltage, a high electric field is formed in this heavily doped impurity layer, and an avalanche multiplication function appears. In this state, when photoelectrons emitted upon incidence of light on the photoelectric surface of the electron tube are accelerated and incident on the electron beam irradiation diode, electron-hole pairs are formed as in the first electron tube, and one of each signal charge moves toward the p-n junction interface. One of each signal charge is avalanche-multiplied immediately before passing through the p-n junction interface. Therefore, the total amount of signal charges reaching the substrate increases as compared to the first electron tube. The multiplied signal charges are output as a signal from the electrodes.

In the fourth electron tube according to the present invention, in addition to the arrangement of the electron beam irradiation diode in the second electron tube, the heavily doped impurity layer having the same conductivity type as that of the lightly doped impurity layer is formed between the substrate and the lightly doped impurity layer. Upon application of a reverse voltage, a high electric field is formed in this heavily doped impurity layer, and an avalanche multiplication function appears. Therefore, a function improved as in the second and third electron tubes with respect to the first electron tube is achieved. As a result, signal charges moving toward the p-n junction interface are efficiently avalanche-multiplied and output as a signal from the electrodes.

DESCRIPTION OF THE PREFERRED EMBODIMENTS

Figure 1A:
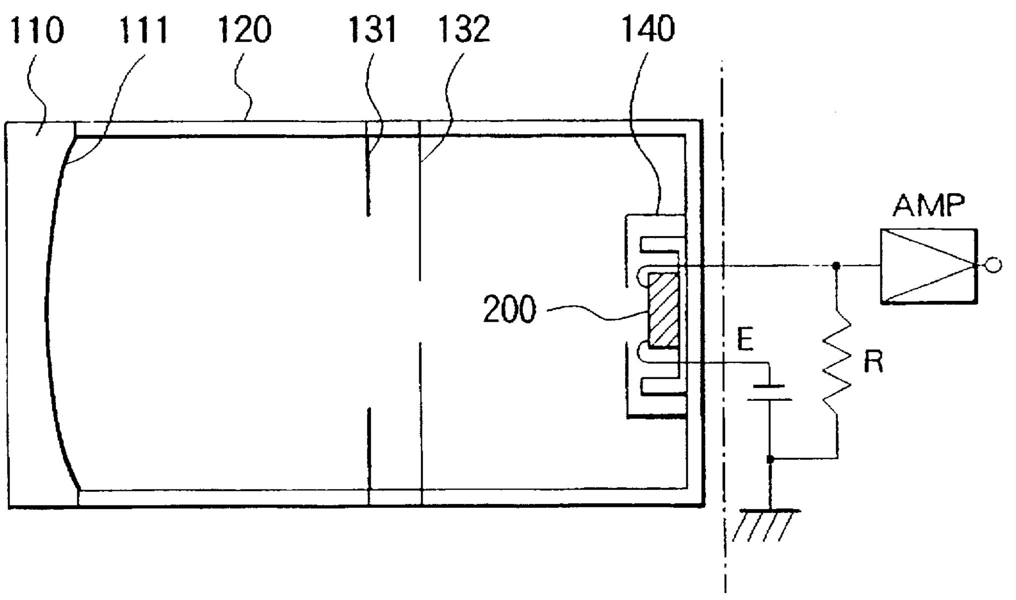
FIGS. 1A and 1B are views showing the arrangement of an electron tube according to the first embodiment of the present invention.

Embodiments of the present invention will be described below with reference to the accompanying drawings. The same reference numerals denote the same elements throughout the drawings, and a detailed description thereof will be omitted.

(First Embodiment)

Figure 1B:
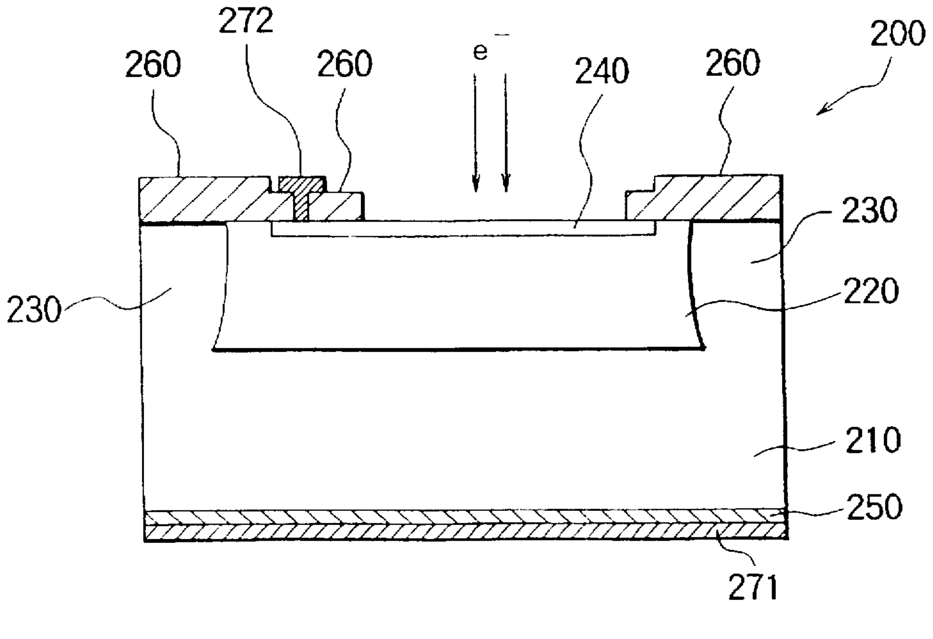

FIGS. 1A and 1B are views showing the arrangement of an electron tube according to the first embodiment, in which FIG. 1A shows the overall arrangement of the electron tube, and FIG. 1B shows the arrangement of an electron beam irradiation diode sealed in the electron tube. For this electron tube, a sealing vessel is constituted by a photoelectric surface plate 110 having a photoelectric surface 111 for emitting electrons upon reception of light, and a glass bulb 120. First and second grids 131 and 132 for focusing electrons emitted from the photoelectric surface, a shielding plate 140 for limiting the path of accelerated electrons, and an electron beam irradiation diode (to be simply referred to as a diode hereinafter) 200 for outputting signal charges upon detection of incident accelerated electrons are incorporated in the sealing vessel. A reverse voltage is applied from a DC power supply (E) to the diode 200 through a load resistor (R). A voltage signal generated across the load resistor (R) when signal charges generated in the diode 200 flow through the load resistor (R) is input to an amplifier (AMP). In the electron tube of this embodiment, the photoelectron acceleration voltage is 10 kv. Therefore, accelerated electrons enter the silicon member to a depth of several μm.

The diode 200 is constituted by a 1-mm square silicon substrate 210 having n-type conductivity, a heavily doped impurity layer (to be referred as a heavily doped n-type layer hereinafter) 250 formed on one surface of the silicon substrate 210 and having n-type conductivity, an anode layer 220 formed on the other surface of the silicon substrate 210 and having p-type conductivity, an isolation layer 230 formed in a region surrounding the anode layer 220 on the other surface of the silicon substrate 210 and having n-type conductivity, a heavily doped impurity layer (to be referred to as a heavily doped p-type layer hereinafter) 240 formed on the surface of the anode layer 220 and having p-type conductivity, a silicon oxide film 260 formed on the surface of the isolation layer and in a region including a portion near the periphery of the heavily doped p-type layer 240, an electrode 271 formed on the surface of the heavily doped n-type layer 250, and an electrode 272 formed on the surface of the heavily doped p-type layer 240.

In this embodiment, the silicon substrate 210 is formed of 200-μm thick silicon containing an n-type impurity for obtaining a resistivity of about 0.01Ω·cm. The anode layer 220 is formed by epitaxially growing silicon containing a p-type impurity for obtaining a resistivity of about 100Ω·cm to a thickness of 40 μm.

The isolation layer 230 is formed such that a p-type layer is formed on one surface of the n-type silicon substrate 210, and thereafter, an n-type impurity is diffused in a predetermined region of the p-type layer (eventually including part of the silicon substrate), thereby preventing the p-n junction interface from being exposed to the side surface. As a result, a dark current is suppressed.

The heavily doped p-type layer 240 has a thickness of 0.1 μm and an impurity concentration of $5\times10^{19}$ $cm^{-3}$. Although a dead band is formed almost throughout the thickness of this layer 240, the dead band becomes thinner than that of the conventional electron beam irradiation diode. Since the anode layer 220 is interposed between the heavily doped p-type layer 240 and the silicon substrate 210, the thickness of the heavily doped p-type layer 240 does not act as a factor that determines the withstand voltage of the p-n junction interface. In addition, growth of a depletion region formed upon application of a reverse voltage can be effectively stopped.

When light is incident on the photoelectric surface 111 of this electron tube, photoelectrons are emitted. The photoelectrons are accelerated and incident on the electron beam irradiation diode 200. A reverse voltage of about 100 V is applied between the electrode 271 and the electrode 272 of the electron beam irradiation diode 200 to form a depletion region almost throughout the anode layer 220 and near the p-n junction interface of the silicon substrate 210. The incident accelerated electrons release a kinetic energy in the heavily doped p-type layer 240 having an electron incidence surface and the depleted anode layer 220 to form electron-hole pairs. In this case, the heavily doped p-type layer 240 having an electron incidence surface is very thin, so the energy is hardly released in this layer, and almost all energy is released in the depletion region. Signal charges extracted from electron-hole pairs formed upon releasing the energy are output as a signal from the electrodes 271 and 272.

Electrons at 10 keV emit all kinetic energy in a region of the silicon member to a depth of several μm. That is, the incident accelerated electrons enter the silicon member to a depth of several μm, and almost all signal charges are generated in the anode layer 220. The rise time of a signal current generated when the signal charges flow through the load resistor (R) is mainly determined by a longer one of the time until holes move from the generation point of the electron-hole pairs to the heavily doped p-type layer 240 and the time until electrons move from the generation point of the electron-hole pairs to the p-n junction interface. The generation point of electron-hole pairs is separated from the accelerated electron incidence surface by several μm, and the thickness of the anode layer 220 is 40 μm. Even when the difference between the mobility of electrons and that of holes in the anode layer 220 is taken into consideration, the rise time of a signal current is determined by the transit time of electrons. The fall time of a signal current is determined by the transit time of electrons in the depletion region in the substrate 210. However, the depletion region in the silicon substrate becomes thin because of the difference between the resistivity of the silicon substrate 210 and that of the anode layer 220, so the fall time is shorter than the rise time.

In the electron tube of this embodiment, the maximum value of the transit time of electrons in the anode layer 220 is obtained as follows. The reverse voltage is 100 V, as described above.

Reverse voltage necessary for depleting the anode layer 220 . . . 60 V

Maximum electric field at the p-n junction portion, which is formed by complete depletion of the anode layer 220 . . . $3\times10^4$ V/cm Electric field formed by a voltage 40 V=(100 V−60 V) . . . $1\times10^4$ V/cm When the mobility of electrons is 1,800 $cm^2/(V\cdot sec)$, the maximum value of the transit time of electrons in the anode layer 220 is about 0.1 nsec. Therefore, the electron tube of this embodiment can operate at a speed on the nanosecond order.

In this embodiment, the anode layer is formed by epitaxial growth. However, it may also be formed by a diffused wafer method or a laminated wafer method.

If an electron tube in which a diode having almost the same operation speed and a larger area is necessary, the depletion layer must be extended in accordance with an increase in junction capacitance to prevent a change in junction capacitance. More specifically, the following techniques can be applied.

(1) The layer growth amount by epitaxial growth is increased. Alternatively, a diffused wafer or laminated wafer is used to form a thick anode layer, and a higher reverse voltage is applied to extend the depletion layer.

(2) The impurity concentration of the silicon substrate is decreased so that the depletion layer extends to the silicon substrate side.

For example, a diffused wafer is used to form an anode layer having a thickness of 80 μm, and a reverse voltage is applied to completely deplete the anode layer. With this processing, the incident area can be increased from a 1-mm square to a 1.5-mm square. In this case, the transit time of signal electrons, that determines the rise and fall times of a signal current, is prolonged in accordance with an increase in thickness of the depletion layer. However, the transit time is inversely proportional to the applied electric field. Therefore, when the reverse voltage to be applied is doubled, a prescribed operation speed can be ensured.

(Second Embodiment)

Figure 2A:
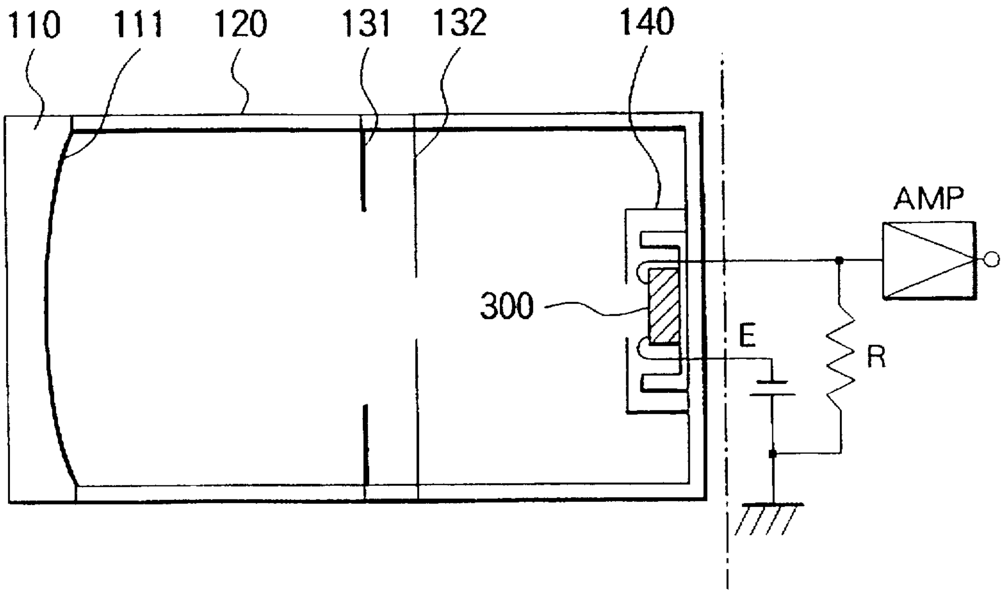
FIGS. 2A and 2B are views showing the arrangement of an electron tube according to the second embodiment of the present invention.
Figure 2B:
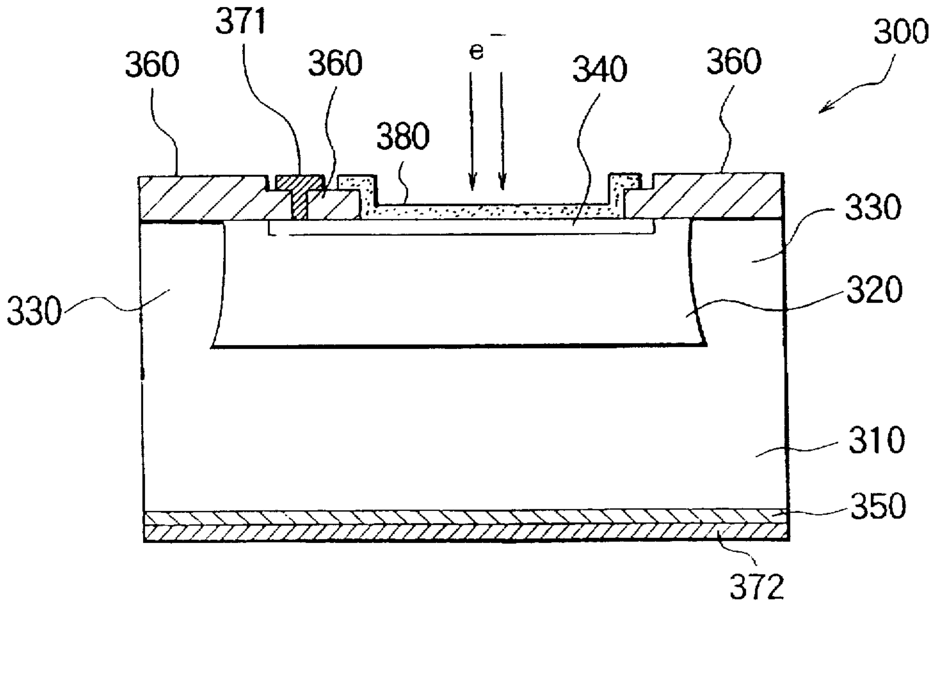

FIGS. 2A and 2B are views showing the arrangement of an electron tube according to the second embodiment, in which FIG. 2A shows the overall arrangement of the electron tube, and FIG. 2B shows the arrangement of an electron beam irradiation diode sealed in the electron tube. This electron tube has the same arrangement as that of the first embodiment except for the sealed electron beam irradiation diode.

An electron beam irradiation diode 300 sealed in the electron tube of this embodiment has the same arrangement as that of the first embodiment. In addition to this arrangement, a wide bandgap layer 380 having p-type conductivity and consisting of a base material with a bandgap larger than that of silicon is formed on the accelerated electron incidence surface.

More specifically, the electron beam irradiation diode 300 is constituted by a 1-mm square silicon substrate 310 having n-type conductivity, a heavily doped n-type layer 350 formed on one surface of the silicon substrate 310, an anode layer 320 formed on the other surface of the silicon substrate 310 and having p-type conductivity, an isolation layer 330 formed in a region surrounding the anode layer 320 on the other surface of the silicon substrate 310, a heavily doped p-type layer 340 formed on the surface of the anode layer 320, a silicon oxide film 360 formed on the surface of the isolation layer 330 and in a region including a portion near the periphery of the heavily doped p-type layer 340, an electrode 372 formed on the surface of the heavily doped n-type layer 350, an electrode 371 formed on the surface of the heavily doped p-type layer 340, and the wide bandgap layer 380 having a thickness of several nm and p-type conductivity.

The wide bandgap layer 380 is formed by depositing silicon carbide or cadmiumtellurium having the same conductivity type as that of the heavily doped p-type layer 340 in a sputtering, PVD, or CVD apparatus. This deposition can be performed at a relatively low temperature, so damage to the silicon member can be prevented. Because of its wide bandgap, this layer is stable to a change in temperature and generates no dark current. The wide bandgap layer 380 forms a heterojunction with the heavily doped p-type layer 340 to set the accelerated electron incidence surface in an accumulation state. In addition, this layer also acts as a passivation layer for protecting the electron beam irradiation diode from being contaminated by an alkali metal generated upon sealing. Although the wide bandgap layer 380 forms a dead band, an increase in dead band due to the wide bandgap layer 380 is almost negligible because it is very thin.

When light is incident on a photoelectric surface 111, photoelectrons are emitted and incident on the diode 300, as in the first embodiment. A reverse voltage of about 100 V is applied between the electrode 371 and the electrode 372 of the diode 300 to form a depletion region almost throughout the anode layer 320 and near the p-n junction interface of the silicon substrate 310. The incident accelerated electrons release a kinetic energy in the heavily doped p-type layer 340 having an electron incidence surface and the depleted anode layer 320 to form electron-hole pairs. In this case, since the wide bandgap layer 380 and the heavily doped p-type layer 340 are thin, the energy is hardly released in these layers, and almost all energy is released in the depletion region. Electron-hole pairs are formed upon releasing the energy. Since a satisfactory accumulation state is set near the accelerated electron incidence surface, electrons in signal charges efficiently reach the p-n junction interface. The efficiently extracted signal charges are output as a signal from the electrodes 371 and 372.

In the electron tube of this embodiment as well, the anode layer may also be formed by a diffused wafer method or a laminated wafer method, as in the first embodiment.

(Third Embodiment)

Figure 3A:
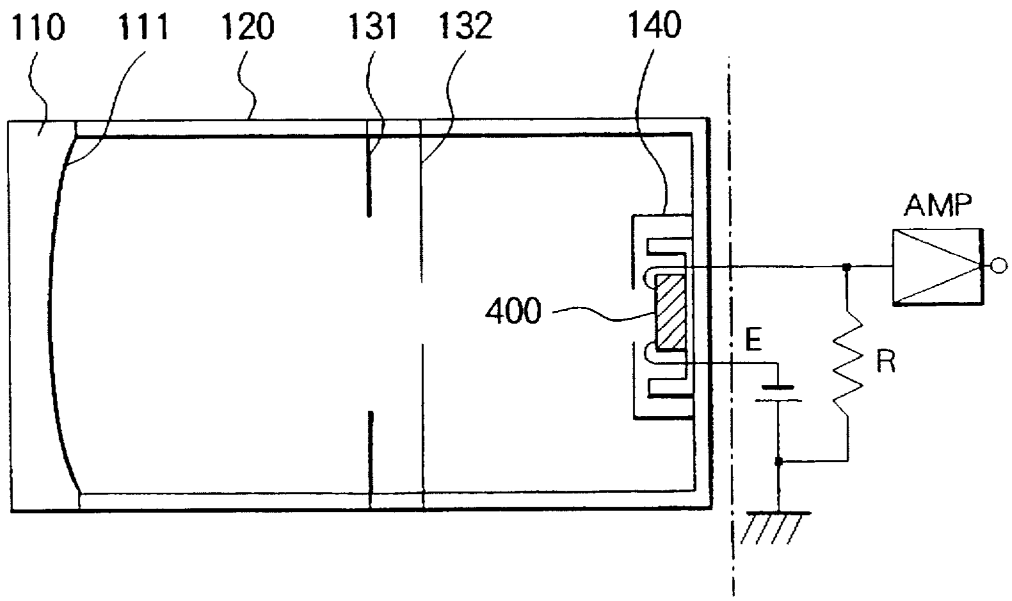
FIGS. 3A and 3B are views showing the arrangement of an electron tube according to the third embodiment of the present invention.
Figure 3B:
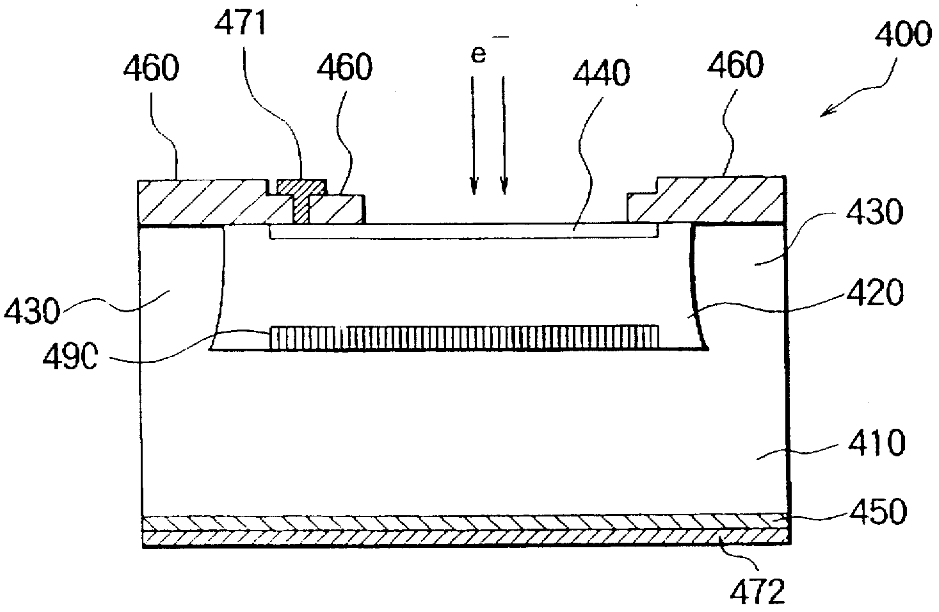

FIGS. 3A and 3B are views showing the arrangement of an electron tube according to the third embodiment, in which FIG. 3A shows the overall arrangement of the electron tube, and FIG. 3B shows the arrangement of an electron beam irradiation diode sealed in the electron tube. This electron tube has the same arrangement as that of the first embodiment except for the sealed electron beam irradiation diode.

An electron beam irradiation diode 400 sealed in the electron tube of this embodiment has the same arrangement as that of the first embodiment. In addition to this arrangement, a heavily doped p-type layer is formed between the substrate and the anode layer. More specifically, the electron beam irradiation diode 400 is constituted by a 1-mm square silicon substrate 410 having n-type conductivity, a heavily doped n-type layer 450 formed on one surface of the silicon substrate 410, a heavily doped p-type layer 490 formed in a predetermined region of the other surface of the silicon substrate 410, an anode layer 420 formed on the other surface of the silicon substrate 410 and having p-type conductivity, an isolation layer 430 formed in a region surrounding the anode layer 420 on the other surface of the silicon substrate 410 and having n-type conductivity, a heavily doped p-type layer 440 formed on the surface of the anode layer 420, a silicon oxide film 460 formed on the surface of the isolation layer 430 and in a region including a portion near the periphery of the heavily doped p-type layer 440, an electrode 472 formed on the surface of the heavily doped n-type layer 450, and an electrode 471 formed on the surface of the heavily doped p-type layer 440.

The heavily doped p-type layer 490 is formed by a burying diffusion method or epitaxial growth. When epitaxial growth is applied, double epitaxial growth is performed. Upon application of a reverse voltage, a high electric field is formed in the heavily doped p-type layer 490, and an avalanche multiplication function appears.

When light is incident on a photoelectric surface 111, photoelectrons are emitted and incident on the diode 400, as in the first embodiment. A reverse voltage of about 100 V is applied between the electrode 471 and the electrode 472 of the diode 400 to form a depletion region almost throughout the anode layer 420 and near the p-n junction interface of the silicon substrate 410. The incident accelerated electrons release a kinetic energy in the heavily doped p-type layer 440 and the depleted anode layer 420 to form electron-hole pairs. In this case, since the heavily doped p-type layer 440 is thin, the energy is hardly released in this layer, and almost all energy is released in the depletion region. Electron-hole pairs are formed upon releasing the energy. Electrons in signal charges are avalanche-multiplied immediately before reaching the p-n junction interface. The multiplied signal charges are output as a signal from the electrodes 471 and 472. The avalanche multiplication factor can normally be set at about 100; a very sensitive electron tube can be realized.

In the electron tube of this embodiment as well, the anode layer may also be formed by a diffused wafer method or a laminated wafer method, as in the first embodiment.

(Fourth Embodiment)

Figure 4A:
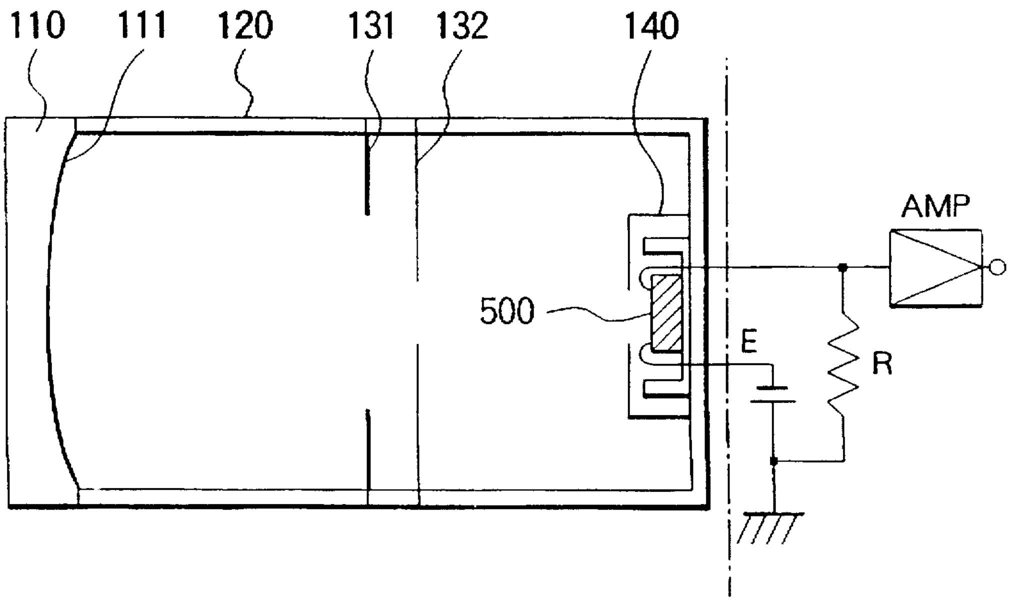
FIGS. 4A and 4B are views showing the arrangement of an electron tube according to the fourth embodiment of the present invention.
Figure 4B:
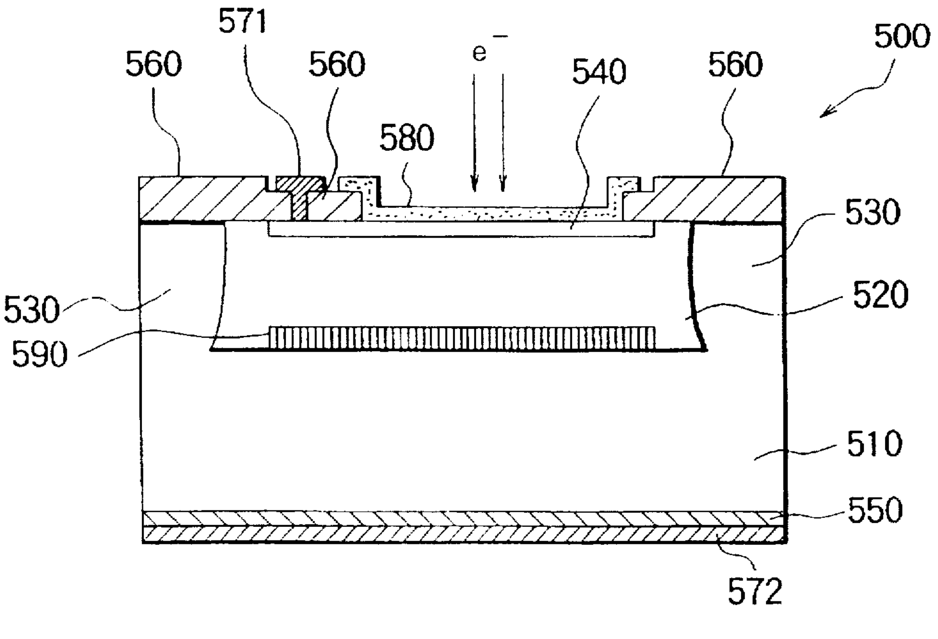
Figures 5A, 5B:
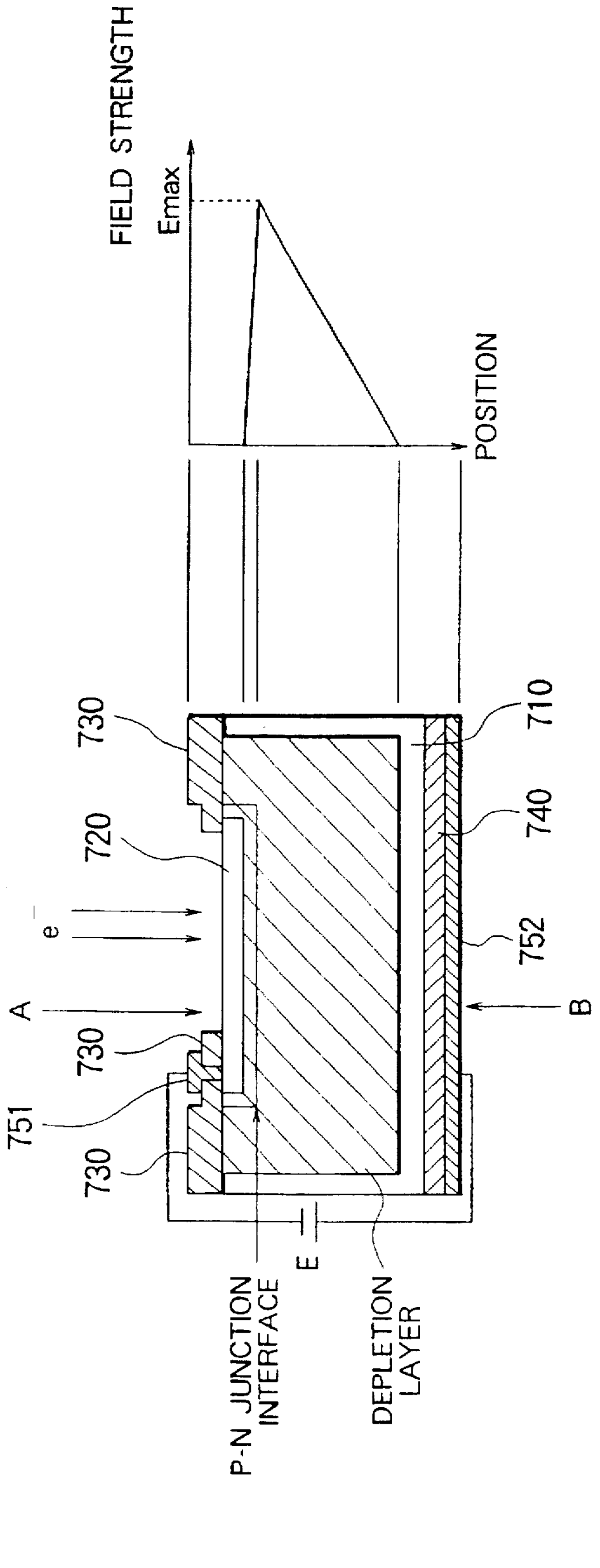
FIGS. 5A and 5B are explanatory views of an electron beam irradiation diode used in a conventional electron tube.

FIGS. 4A and 4B are views showing the arrangement of an electron tube according to the fourth embodiment, in which FIG. 4A shows the overall arrangement of the electron tube, and FIG. 4B shows the arrangement of an electron beam irradiation diode sealed in the electron tube. This electron tube has the same arrangement as that of the first embodiment except for the sealed electron beam irradiation diode.

An electron beam irradiation diode 500 sealed in the electron tube of this embodiment has the same arrangement as that of the first embodiment. In addition to this arrangement, a wide bandgap layer 580 having p-type conductivity and consisting of a base material with a bandgap larger than that of silicon is formed on the accelerated electron incidence surface. More specifically, the electron beam irradiation diode 500 is constituted by a 1-mm square silicon substrate 510 having n-type conductivity, a heavily doped n-type layer 550 formed on one surface of the silicon substrate 510, a heavily doped p-type layer 590 formed in a predetermined region of the other surface of the silicon substrate 510, an anode layer 520 formed on the other surface of the silicon substrate 510 and having p-type conductivity, an isolation layer 530 formed in a region surrounding the anode layer 520 on the other surface of the silicon substrate 510 and having n-type conductivity, a heavily doped p-type layer 540 formed on the surface of the anode layer 520, a silicon oxide film 560 formed on the surface of the isolation layer 530 and in a region including a portion near the periphery of the heavily doped p-type layer 540, an electrode 572 formed on the surface of the heavily doped n-type layer 550, an electrode 571 formed on the surface of the heavily doped p-type layer 540, and the wide bandgap layer 580 having a thickness of several nm and p-type conductivity.

The wide bandgap layer 580 is formed by the same method as in the second embodiment, and the heavily doped p-type layer 590 is formed by the same method as in the third embodiment.

When light is incident on a photoelectric surface 111, photoelectrons are emitted and incident on the diode 500, as in the first embodiment. A reverse voltage of about 100 V is applied between the electrode 571 and the electrode 572 of the diode 500 to form a depletion region almost throughout the anode layer 520 and near the p-n junction interface of the silicon substrate 510. The incident accelerated electrons release a kinetic energy in the heavily doped p-type layer 540 and the depleted anode layer 520 to form electron-hole pairs. In this case, since the wide bandgap layer 580 and the heavily doped p-type layer 540 are thin, the energy is hardly released in these layers, and almost all energy is released in the depletion region. Electron-hole pairs are formed upon releasing the energy. Electrons in signal charges efficiently move toward the p-n junction interface and are avalanche-multiplied immediately before reaching the p-n junction interface. The multiplied signal charges are output as a signal from the electrodes 571 and 572.

In the electron tube of this embodiment as well, the anode layer may also be formed by a diffused wafer method or a laminated wafer method, as in the first embodiment.

As has been described above in detail, according to the first electron tube of the present invention, the p-n junction interface in the sealed electron beam irradiation diode is formed by a substrate lightly doped with an impurity and a lightly doped impurity layer. A thin heavily doped impurity layer having the same conductivity type as that of the lightly doped impurity layer is formed on the surface of the lightly doped impurity layer, which is opposite to the p-n junction interface, thereby forming a depletion region throughout the lightly doped impurity layer in the direction of its thickness upon application of a reverse voltage. With this arrangement, the dead band can be made thin, and an electron tube having improved sensitivity and accuracy can be realized. In addition, an isolation diffusion layer is formed around the side surface of the lightly doped impurity layer. Therefore, the dark current is suppressed by preventing the p-n junction interface from being exposed, and improvement in sensitivity and accuracy of the electron tube can be achieved.

In the second electron tube according to the present invention, in addition to the arrangement of the electron beam irradiation diode in the first electron tube, a very thin wide gap layer is formed on the accelerated electron incidence surface to form a heterojunction with the accelerated electron incidence surface. As a result, a satisfactory accumulation state for signal charges appears, and the signal charges efficiently reach the p-n junction interface. Therefore, an electron tube having sensitivity and accuracy higher than those of the first electron tube can be realized.

In the third electron tube according to the present invention, in addition to the arrangement of the electron beam irradiation diode in the first electron tube, a heavily doped impurity layer having the same conductivity type as that of the lightly doped impurity layer is formed between the substrate and the lightly doped impurity layer. Upon application of a reverse voltage, a high electric field is formed in this heavily doped impurity layer, and an avalanche multiplication function takes effect. Therefore, output signal charges generated when the incident accelerated electron release a kinetic energy increase, and an electron tube having sensitivity and accuracy much higher than those of the first electron tube can be realized.

In the fourth electron tube according to the present invention, in addition to the arrangement of the electron beam irradiation diode in the second electron tube, a heavily doped impurity layer having the same conductivity type as that of the lightly doped impurity layer is formed between the substrate and the lightly doped impurity layer. Upon application of a reverse voltage, a high electric field is formed in this heavily doped impurity layer, and an avalanche multiplication function appears. Therefore, an electron tube having sensitivity and accuracy improved as in the second and third electron tubes with respect to the first electron tube can be realized.

Particularly, when avalanche multiplication is utilized as in the third or fourth photoelectric tube, a very high gain can be obtained, and a single photon can be detected. In addition, since instability in gain due to dynodes, which poses a problem in a photomultiplier, is suppressed and the response characteristics are improved, a supersensitive photodetector allowing an ultraspeed operation can be realized. Furthermore, since fluctuations in multiplication are small as compared to a photomultiplier, incident photon counting is enabled.

What is claimed is:

1. An electron tube in which a semiconductor electron beam detector is sealed, said semiconductor electron beam detector comprising:

a silicon substrate having a first conductivity type and having first and second main surfaces which are opposite to each other through the substrate itself;

a lightly doped impurity layer formed on said first main surface of said silicon substrate and having a second conductivity type;

a semiconductive isolation layer formed in a region surrounding said lightly doped impurity layer on said first main surface of said silicon substrate and having the first conductivity type;

a first heavily doped impurity layer formed on a surface of said lightly doped impurity layer and having the second conductivity type, said lightly doped impurity layer receiving an electron through said first heavily doped impurity layer;

a first electrode contacting said first heavily doped impurity layer; and a second electrode provided at a position opposite to said first heavily doped impurity layer through said substrate; and a silicon oxide film formed on a surface of said isolation layer and in a region including a portion near a periphery of a surface of said first heavily doped layer.

2. An electron tube according to claim 1, wherein said semiconductor electron beam detector further comprises:

a second heavily doped impurity layer formed on said second main surface of said silicon substrate and having the first conductivity type and inserted between said second main surface and said second electrode.

3. An electron tube in which a semiconductor electron beam detector is sealed, said semiconductor electron beam detector comprising:

a silicon substrate having a first conductivity type;

a lightly doped impurity layer formed on one surface of said silicon substrate and having a second conductivity type;

an isolation layer formed in a region surrounding said lightly doped impurity layer on said one surface of said silicon substrate and having the first conductivity type;

a first heavily doped impurity layer formed on a surface of said lightly doped impurity layer and having the second conductivity type;

a silicon oxide film formed on a surface of said isolation layer and in a region including a portion near a periphery of a surface of said first heavily doped layer;

a first electrode formed on said surface of said first heavily doped impurity layer; and a wide bandgap layer formed in a region of said surface of said first heavily doped impurity layer excluding a region where said silicon oxide film is formed and a region where said first electrode is formed, said wide bandgap layer consisting of a semiconductor material having a bandgap larger than that of said first heavily doped impurity layer consisting of a semiconductor material and having the second conductivity type, and forming a heterojunction with said first heavily doped impurity layer, electrons being incident from a surface of said wide bandgap layer.

4. An electron tube according to claim 3, wherein said semiconductor electron beam detector further comprises:

a second heavily doped impurity layer formed on the other surface of said silicon substrate and having the first conductivity type; and a second electrode formed on a surface of said second heavily doped impurity layer.

5. An electron tube in which a semiconductor electron beam detector is sealed, said semiconductor electron beam detector comprising:

a silicon substrate having a first conductivity type and having first and second main surfaces which are opposite through the substrate itself;

a first heavily doped impurity layer formed in a first region of said first main surface of said silicon substrate and having a second conductivity type;

a lightly doped impurity layer formed in a second region surrounding said first region of said first main surface of said silicon substrate and on a surface of said first heavily doped impurity layer and having the second conductivity type;

a semiconductive isolation layer formed in a region surrounding said lightly doped impurity layer on said first main surface of said silicon substrate and having the first conductivity type;

a second heavily doped impurity layer formed on a surface of said lightly doped impurity layer and having the second conductivity type, said lightly doped impurity layer receiving an electron through said second heavily doped layer, said lightly doped impurity layer receiving an electron through said second heavily doped layer;

a first electrode electrically contacting said second heavily doped impurity layer;

a second electrode provided at a position opposite to said second heavily doped impurity layer through said substrate; and a silicon oxide film formed on a surface of said isolation layer and in a region including a portion near a periphery of a surface of said second heavily doped layer.

6. An electron tube according to claim 5, wherein said semiconductor electron beam detector further comprises:

a third heavily doped impurity layer inserted between the second surface of said silicon substrate and said second electrode, and having the first conductivity type.

7. An electron tube in which a semiconductor electron beam detector is sealed, said semiconductor electron beam detector comprising:

a silicon substrate having a first conductivity type;

a first heavily doped impurity layer formed in a first region of one surface of said silicon substrate and having a second conductivity type;

a lightly doped impurity layer formed in a second region surrounding said first region of said one surface of said silicon substrate and on a surface of said first heavily doped impurity layer and having the second conductivity type;

an isolation layer formed in a region surrounding said lightly doped impurity layer on said one surface of said silicon substrate and having the first conductivity type;

a second heavily doped impurity layer formed on a surface of said lightly doped impurity layer and having the second conductivity type;

a silicon oxide film formed on a surface of said isolation layer and in a region including a portion near a periphery of a surface of said second heavily doped layer;

a first electrode formed on said surface of said second heavily doped impurity layer; and a wide bandgap layer formed in a region of said surface of said second heavily doped impurity layer excluding a region where said silicon oxide film is formed and a region where said first electrode is formed, said wide bandgap layer consisting of a semiconductor material having a bandgap larger than that of said second heavily doped impurity layer consisting of a semiconductor material and having the second conductivity type, and forming a heterojunction with said second heavily doped impurity layer, electrons being incident from a surface of said wide bandgap layer.

8. An electron tube according to claim 7, wherein said semiconductor electron beam detector further comprises:

a third heavily doped impurity layer formed on the other surface of said silicon substrate and having the first conductivity type; and a second electrode formed on said surface of said third heavily doped layer.

* * * * *